United States Patent
Ruegg et al.

(10) Patent No.: US 6,690,525 B2
(45) Date of Patent: Feb. 10, 2004

(54) HIGH-SPEED PROGRAMMABLE SYNCHRONOUS COUNTER FOR USE IN A PHASE LOCKED LOOP

(75) Inventors: Michael A. Ruegg, Santa Cruz, CA (US); Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 307 days.

(21) Appl. No.: 09/865,397

(22) Filed: May 25, 2001

(65) Prior Publication Data

US 2002/0176194 A1 Nov. 28, 2002

(51) Int. Cl.[7] .................................................. G11B 5/09
(52) U.S. Cl. .......................... 360/51; 331/25; 375/376; 377/52; 713/502
(58) Field of Search .................... 331/25; 375/376; 360/51; 377/37, 47, 48, 52, 107, 110, 118; 713/400, 502, 503

(56) References Cited

U.S. PATENT DOCUMENTS

| 5,818,895 | A | 10/1998 | Oh |
| 6,226,345 | B1 | 5/2001 | Skergan |
| 6,512,404 | B2 * | 1/2003 | Ruegg et al. ................ 327/157 |
| 6,552,865 | B2 * | 4/2003 | Cyrusian ...................... 360/31 |

OTHER PUBLICATIONS

"Synchronous Recording Channels—PRML & Beyond", rev. 5.61 14.E 18, 1999, published by Knowledge Tek, Inc., Broomfield, Colorado.

"PRML: Seagate Uses Space Age Technology" available on the Internet at http://www.seagate.com/support/kb/disc/prm-l.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

*Primary Examiner*—Alan T. Faber
(74) *Attorney, Agent, or Firm*—Brinks Hofer Gilson & Lione

(57) ABSTRACT

A high-speed programmable synchronous counter is disclosed. The high speed counter includes a most-significant-bit counter synchronized with a least-significant bit counter. The least-significant-bit counter is programmed to an initial state and configured to decrement a state with each pulse of a clock wave. The least-significant-bit counter provides an output signal when the least-significant-bit counter has a zero-count state. The most-significant-bit counter decrements when the least-significant-bit counter has a zero-count state and provides an output signal when the least-significant-bit counter has a zero-count state. A counter output pulse is generated and the high-speed counter is reset to the initial state when both the least-significant bit counter and the most-significant bit counter have a zero-count state.

32 Claims, 9 Drawing Sheets

HIGH-SPEED PROGRAMMABLE SYNCHRONOUS COUNTER FOR USE IN A PHASE LOCKED LOOP

BACKGROUND

Computer hard disk drives, also known as fixed disk drives or hard drives, have become a de facto data storage standard for computer systems. Their proliferation can be directly attributed to their low cost, high storage capacity and reliability, in addition to wide availability, low power consumption, fast data transfer speeds and decreasing physical size.

Disk drives typically include one or more rotating magnetic platters encased within an environmentally controlled housing. The hard drive may have several read/write heads that interface with the magnetic platters. The disk drive may further include electronics for reading and writing data and for interfacing with other devices. The electronics are coupled with the read/write heads and include circuits to control head-positioning and to generate or sense electromagnetic fields on the platters. The electronics encode data received from a host device, such as a personal computer, and translate the data into magnetic encodings, which are written onto the platters. When data is requested, the electronics locate the data, sense the magnetic encodings, and translate the encodings into binary digital information. Error checking and correction may also be applied to ensure accurate storage and retrieval of data.

The read/write heads detect and record the encoded data as areas of magnetic flux. The data are encoded by the presence or absence of a flux reversal between two contiguous areas of the platter. Data may be read using a method known as "Peak Detection" by which a voltage peak imparted in the read/write head is detected when a flux reversal passes the read/write head. However, increasing storage densities, requiring reduced peak amplitudes, better signal discrimination and higher platter rotational speeds are pushing the peaks in closer proximity. Thus, peak detection methods are becoming increasingly complex.

Advancements in read/write heads and in the methods of interpreting magnetic encodings have been made. For example, magneto-resistive ("MR") read/write heads have been developed. MR heads have been designed with increased sensitivity and increased signal discrimination. In addition, technology known as Partial Response Maximum Likelihood ("PRML") has been developed. PRML based disk drives function based an algorithm implemented in the disk drive electronics to read analog waveforms generated by the magnetic flux reversals. Instead of looking for peak values, PRML based drives digitally sample the analog waveform (the "Partial Response") and carry out advanced signal processing techniques to determine a most-likely bit pattern represented by the wave form (the "Maximum Likelihood"). PRML technology tolerates more noise in the magnetic signals, permitting use of lower quality platters and read/write heads, which also increases manufacturing yields and lowers costs.

With hard drives typically differentiated by factors such as cost/unit of storage, data transfer rate, power requirement, and form factor (physical dimensions), there is a need for enhanced hard drive components which prove cost effective in increasing storage capacity, operating speed, reliability and power efficiency. For example, PRML electronics may include a phase locked loop ("PLL") that provides a feedback clock signal used to synchronize read and write operations for the PRML based hard drive. The feedback clock signal may be derived by a counter from a output clock signal of a Voltage Controlled Oscillator ("VCO"). The counter, also referred to as a divider, derives the feedback clock signal by generating a clock pulse when a desired number of the high-speed clock pulses have been counted. Accordingly, the counter provides a feedback clock signal having a modulus frequency of the output clock.

With the VCO output clock signal frequency increasing, a need for larger counters to provide a feedback clock signal having a desired modulus frequency of the VCO output clock signal frequency also increases. However, as the counter size grows, the counter speed of the counter decreases. Counter designs may provide increased speed but are not programmable.

Accordingly, there is a need in the art for a high-speed programmable synchronous counter.

SUMMARY

A high-speed programmable synchronous counter which may be used in a partial response, maximum likelihood ("PRML") read/write channel is disclosed. The counter, also referred to as a divider, may be provided in a feedback circuit of a Phase Locked Loop ("PLL"). The counter derives a feedback clock signal from an output clock signal of a Voltage Controlled Oscillator ("VCO") of the Phase Locked Loop ("PLL").

An embodiment for a programmable synchronous high-speed counter includes a clock input; a least-significant-bit counter; a most-significant-bit counter; a count input circuit; and a counter output circuit. The clock input may be configured to receive a clock signal at an input node. The clock signal may be a high-speed output clock provided by a VCO.

The least-significant-bit counter may be coupled with the clock input node. The least-significant-bit counter is configured to decrement a least-significant-bit count value in response to a clock signal. The least significant-bit counter further provides a signal at an output node for the least significant-bit counter when the least significant-bit counter decrements to a zero-count value.

The most-significant-bit counter may be coupled with the least-significant-bit output node. When the least-significant-bit counter provides the zero-count signal at the output node, the most-significant-bit counter decrements a most-significant-bit count value. The most-significant-bit counter also provides a signal at an output node for the most-significant-bit zero when the most-significant-bit counter decrements to a zero-count value.

The least-significant-bit counter may be further coupled with the output node for the most-significant-bit counter. The least-significant-bit counter resets to a highest count value for the least-significant-bit counter, when the least-significant-bit counter has a zero-count value and the most-significant-bit output signal has a non-zero count value. The least-significant-bit and most significant bit counters reload to an initial state when the least-significant-bit and most-significant-bit counters have a zero count value.

The count input circuit receives a count value that is to be programmed into the counter. The count value is includes least-significant bits and most-significant bits. The count input circuit programs the initial state for the least-significant-bit counter with the least significant bits and the initial state for the most-significant-bit counter with the most significant bits.

The counter output is coupled with the outputs of the least-significant-bit counter and the most-significant-bit counter. The counter output circuit provides a clock pulse at a counter output node in response to the least-significant-bit zero state signal and the most-significant-bit zero state signal.

An embodiment of a method for counting high-speed clock pulses includes the acts of: receiving a clock signal; receiving a count value including least significant bits and most significant bits; programming a least-significant-bit counter with the least-significant bits and a most-significant-bit counter with the most-significant bits; decrementing the least-significant-bit counter in response to the clock signal and generating a least-significant-bit zero-count signal when the least-significant-bit counter has a zero value; decrementing the most-significant-bit counter in response to the least-significant-bit zero-count signal and generating a most-significant-bit zero-count signal when the most-significant-bit counter has a zero value; and generating an output signal in response to the least-significant-bit zero-count signal and the most-significant-bit zero-count signal.

The foregoing discussion of the summary of the invention is provided only by way of introduction. Nothing in this section should be taken as a limitation on the claims, which define the scope of the invention. Additional objects and advantages of the present invention will be set forth in the description that follows, and in part will be obvious from the description, or may be learned by practice of the present invention. The objects and advantages of the present invention may be realized and obtained by means of the instrumentalities and combinations particularly pointed out in the claims.

DETAILED DESCRIPTION

The embodiments described herein relate to a partial response, maximum likelihood ("PRML") based read/write channel. The read/write channel is coupled with the read/write heads of a hard drive. Herein, the phrase "coupled with" is defined to mean directly connected to or indirectly connected through one or more intermediate components. Such intermediate components may include both hardware and software based components. The read/write channel converts digital data from a host device into electrical impulses to control a read/write head to magnetically read and record data to the hard disk. During read operations, the read/write channel receives an analog waveform magnetically sensed by the read/write heads and converts that waveform into the digital data stored on the drive.

The illustrated embodiments provide a high-speed programmable synchronous counter ("High-Speed Counter") for use in a phase locked loop ("PLL") of a PRML based read/write channel. The high-speed counter derives a clock signal from a high-speed output clock generated by a Voltage Controlled Oscillator ("VCO"). The clock signal is derived by generating a clock signal pulse at a counter output node when a programmed number of pulses of the VCO output clock signal has been received at a counter input node. Accordingly, the high-speed counter provides a clock signal that has a modulus frequency of the VCO output clock signal.

The high-speed counter may be programmed to generate a clock signal having the desired modulus frequency of the VCO output clock signal. The clock signal may be used in a feedback circuit of a PLL, to control the frequency of the VCO output clock signal. For example, when it is desired for the VCO output clock signal to have a frequency that is 20 times the frequency of a reference clock signal, the counter is programmed with a count value of 20. With a count value of 20, the high-speed counter will generate a clock signal pulse for every 20 pulses of the VCO output clock signal. The clock signal pulses collectively will form a feedback clock signal. The feedback clock signal may be compared with the reference clock signal and the VCO adjusted to provide a VCO output clock signal that is 20 times that of the reference clock signal. When the reference clock signal has a frequency of 40 Megahertz, for example, the VCO output clock signal will be synchronized at 20 times the reference clock signal frequency to have a frequency of 800 Megahertz.

Figure 1A:
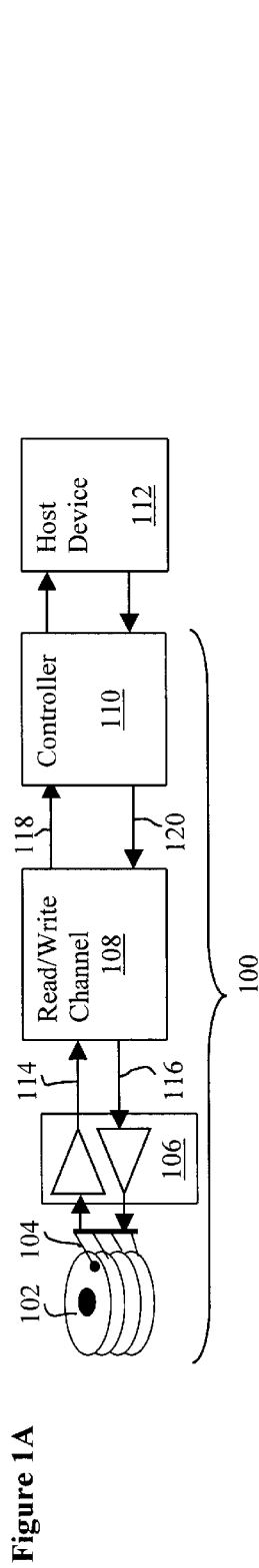
FIG. 1A depicts a block diagram of an exemplary hard drive coupled with a host device.

The present embodiments will be explained with reference to accompanying FIGS. 1 through 9. Referring now to FIG. 1A, a block diagram for a hard drive 100 coupled with a host device 112 is shown. For clarity, some components, such as a servo/actuator motor control, are not shown. The drive 100 includes the magnetic surfaces and spindle motor 102, the read/write heads and actuator assembly 104, pre-amplifiers 106, a read/write channel 108 and a controller 110. The pre-amplifiers 106 are coupled with the read/write channel 108 via interfaces 114 and 116. The controller 110 interfaces with the read/write channel 108 via interfaces 118 and 120.

For reads from the hard disk 100, the host device 112 provides a location identifier that identifies the location of the data on the disk drive, e.g. a cylinder and sector address. The controller 110 receives this address and determines the physical location of the data on the platters 102. The controller 110 then moves the read/write heads into the proper position for the data to spin in proximity to the read/write heads 104. As the data spins, the read/write head 104 senses the presence or absence of flux reversals, generating a stream of analog signal data. This data is passed to the pre-amplifiers 106 which amplify the signal and pass the data to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write the data. The controller 110 moves the read/write heads 104 to a designated location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The signals are passed to the pre-amplifiers 106 via interface 116 which drive the read/write heads 104.

Figure 1B:
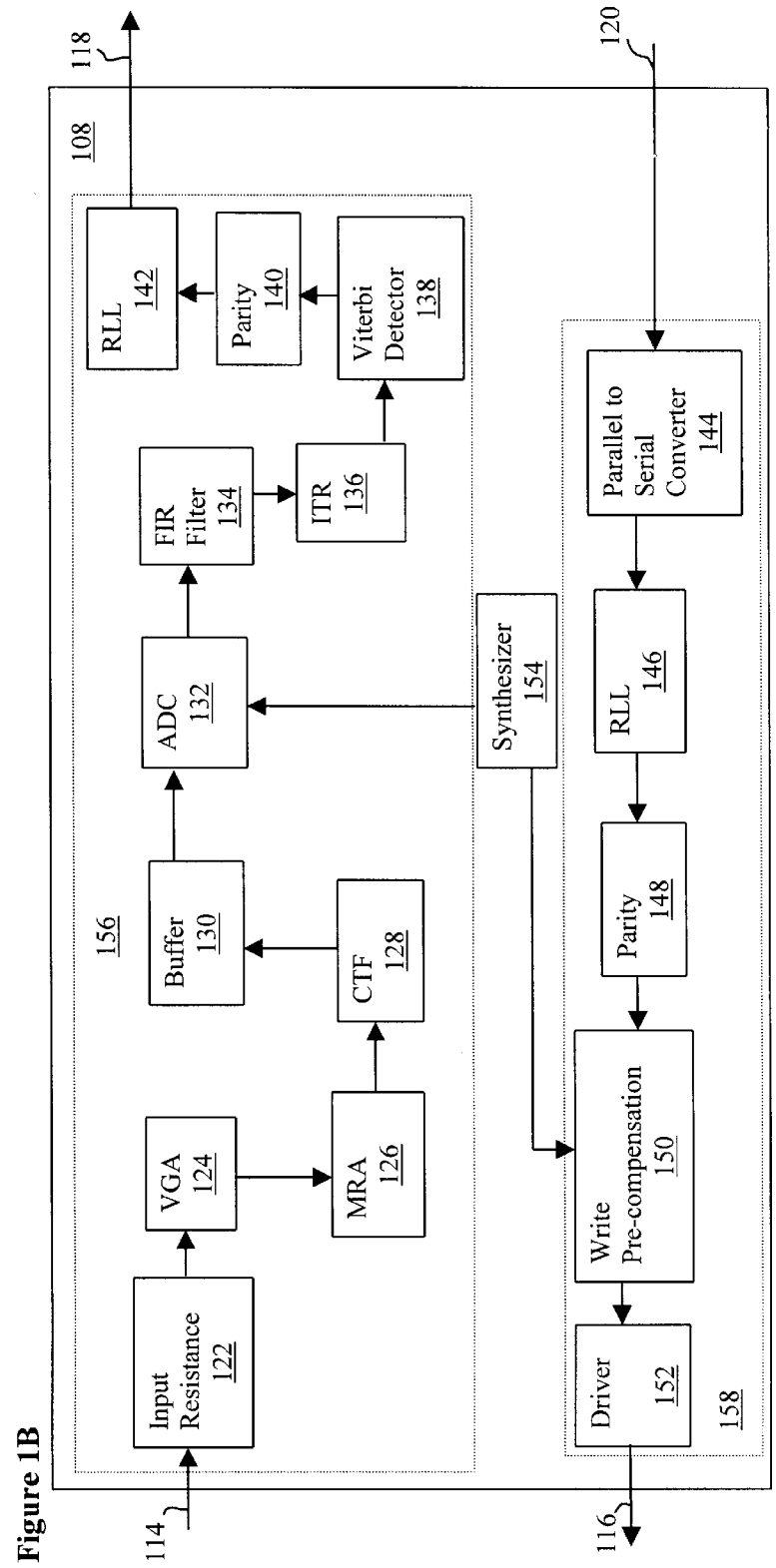
FIG. 1B depicts a block diagram of read/write channel for use with a hard drive.

Referring to FIG. 1B, an exemplary read/write channel 108 is shown that supports Partial Response Maximum Likelihood ("PRML") encoding technology for use with the hard drive 100 of FIG. 1A. For clarity, some components have been omitted. The read/write channel 108 may be implemented as an integrated circuit using a complementary metal oxide semiconductor ("CMOS") process for transistors having an effective channel length of 0.18 micron. It will be appreciated that other process technologies and feature sizes may be used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel-to-serial converter 144, a run-length-limited ("RLL") encoder 146, a parity encoder 148, a write pre-compensation circuit 150 and a driver circuit 152. The parallel to serial converter 144 receives data from the host device 112 via the interface 120 eight bits at a time. The converter 144 serializes the input data and sends a serial bit stream to the RLL encoder 146. The RLL encoder 146 encodes the serial bit stream into symbolic binary sequences according to a run-length limited algorithm for recording on the platters 102. The exemplary RLL encoder may use a 32/33 bit symbol code to ensure that flux reversals are properly spaced and that long runs of data without flux reversals are not recorded. The RLL encoded data is then passed to the parity encoder 148 that adds a parity bit to the data. In the exemplary parity encoder 148, odd parity is used to ensure that long run's of 0's and 1's are not recorded due to the magnetic properties of such recorded data. The parity-encoded data may be subsequently treated as an analog signal rather than a digital signal. The analog signal is passed to a write pre-compensation circuit 150 that dynamically adjusts the pulse widths of the bit stream to account for magnetic distortions in the recording process. The adjusted analog signal is passed to a driver circuit 152 that drives the signal to the pre-amplifiers 106 via interface 116 to drive the read/write heads 104 and record the data. The exemplary driver circuit 152 includes a pseudo emitter coupled logic ("PECL") driver circuit that generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140, and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 that is a switching circuit to attenuate the signal and account for any input resistance. The attenuated signal is then passed to a VGA 124 that amplifies the signal. The amplified signal is then passed to the MRA 126 that adjusts the signal for any distortion created by the recording process. Essentially, the MRA 126 performs the opposite function of the write-pre-compensation circuit 150 in the write path 158. The signal is next passed through the CTF 128, which may be essentially a low pass filter, to filter out noise. The filtered signal is then passed to the ADC 132 via the buffer 130 that samples the analog signal and converts it to a digital signal. The digital signal is then passed to a FIR filter 134 and then to a timing recovery circuit 136.

The timing recovery circuit 136 may be connected (not shown in the figure) to the FIR filter 134, the MRA 126 and the VGA 124 in a feedback orientation to adjust these circuits according to the signals received to provide timing compensation. The exemplary FIR filter 134 may be a ten-tap FIR filter. The digital signal is then passed to the Viterbi algorithm detector 138 that determines the binary bit pattern represented by the digital signal using digital signal processing techniques. The exemplary Viterbi algorithm detector 138 uses a 32 state Viterbi processor. The binary data represented by the digital signal is then passed to the parity decoder 140, which removes the parity bit, and then to the RLL decoder 142. The RLL decoder 142 decodes the binary RLL encoding symbols to the actual binary data. This data is then passed to the controller 110 via the interface 118.

Figure 2:
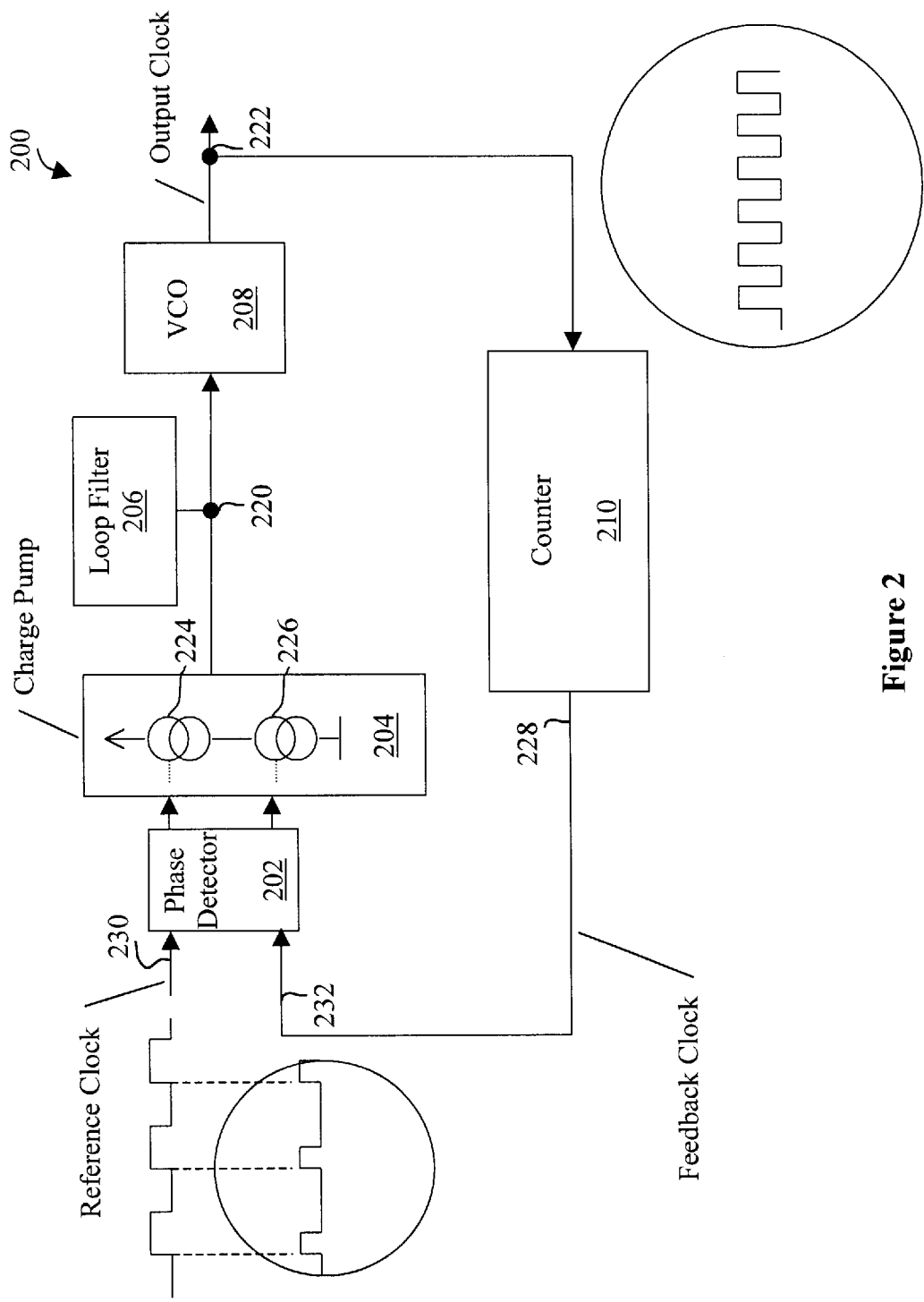
FIG. 2 is a block diagram of an exemplary phase locked loop for a read/write channel.

The read/write channel 108 further includes a clock synthesizer 154 that may include a phase locked loop ("PLL"). Referring now to FIG. 2, an exemplary circuit 200 for a PLL that includes a high-speed programmable synchronous counter ("Counter") 210 is shown. The PLL includes a phase detector 202, a charge pump 204, a loop filter 206, a voltage controlled oscillator ("VCO") 208, and the counter 210 provided in a feedback loop between the VCO 208 and the phase detector 202.

The phase detector 202 compares two input signals, determines a delay between the input signals and generates control signals at an output correlating to the delay. The phase detector 202 output may be coupled with the charge pump 204. In response to the control signals from the phase detector 202, the charge pump 204 charges or discharges the loop filter 206 by providing positive or negative current, respectively, at a loop filter node 220. The loop filter 206 maintains a voltage at the loop filter node 220. The VCO 208 is coupled with the loop filter node 220. The VCO generates a VCO output clock signal at an output clock node 222 in response to the voltage at loop filter node 220. The VCO 208 varies the frequency of the VCO output clock signal based on the potential at the loop filter node 220.

The charge pump 204 may be any conventionally designed charge pump configured to provide current to a loop filter node. The charge pump 204 may include an up current source 224 selectively coupled with the loop filter 206 at the loop filter node 220. The charge pump 204 may further include a down-current source 226 selectively coupled with the loop filter 206 at the loop filter node 220. In an embodiment, the charge pump is described in commonly assigned U.S. Pat. No. 6,512,404, titled "LOW VOLTAGE CHARGE PUMP FOR PHASE LOCKED LOOP," by Michael A. Ruegg et al., filed on May 15, 2001, which is incorporated by reference herein in its entirety.

The charge pump 204 may further include an offset cancellation circuit, to cancel offset from the phase detector 202 and the charge pump 204. In one embodiment the offset cancellation circuit is described in commonly assigned U.S. patent application No. 09/865,406, Publication No. 2002/0176188, titled "OFFSET CANCELLATION OF CHARGE PUMP BASED PHASE DETECTOR," by Michael A. Ruegg et al., filed on May 25, 2001, which is incorporated by reference herein in its entirety.

The loop filter 206 may be coupled with the charge pump 204 and the VCO 208 at the loop filter node 220. The loop filter 206 may be a conventional low-pass filter, including capacitive devices and resistive devices (not shown). The loop filter 206 is capable of maintaining a voltage at the loop filter node 220 based on current provided to the loop filter node 220.

The VCO 208 may be coupled with the loop filter 206 at the loop filter node 220. The VCO 208 generates an VCO output clock signal at an output node 222. The VCO output clock signal is used for synchronizing read and write operations for the PRML based hard drive.

The counter 210 may be coupled with the output clock node 222. The VCO output clock signal is received at an input of the high-speed counter 210. The counter 210 derives a feedback clock signal by counting pulses of the VCO output clock signal and providing a feedback clock pulse for each occurrence of a programmed number of sequential output clock pulses. The counter provides the feedback clock pulse at a counter output node 228. By way of example, when an VCO output clock signal at the output clock node 222 has a frequency of 800 Megahertz and the counter 210 is programmed to count 20 output clock pulses, the counter 210 will provide an output clock pulse for each of 20 output clock pulses. Accordingly, the feedback clock signal will have a frequency of 40 Megahertz (1/20th of the VCO output clock signal).

The phase detector 202 controls the charge pump 204 to charge or discharge the potential at the loop filter node 238. The phase detector 202 includes a first phase detector input 230 and a second phase detector input 232. The phase detector 202 determines whether to charge or discharge the loop filter 206 based on a delay between input signals at the first input 230 and the second input 232. In a conventional PLL circuit, a reference signal is provided at the first phase detector input 230 and the feedback clock signal is provided to the second phase detector input 232. The phase detector 202 compares the delay between the feedback clock signal and controls the charge pump 204 to discharge or charge the loop filter 206. The potential at the loop filter node 220 is adjusted to synchronize a rising edge of feedback clock with a rising edge of the reference clock signal.

Figure 3:
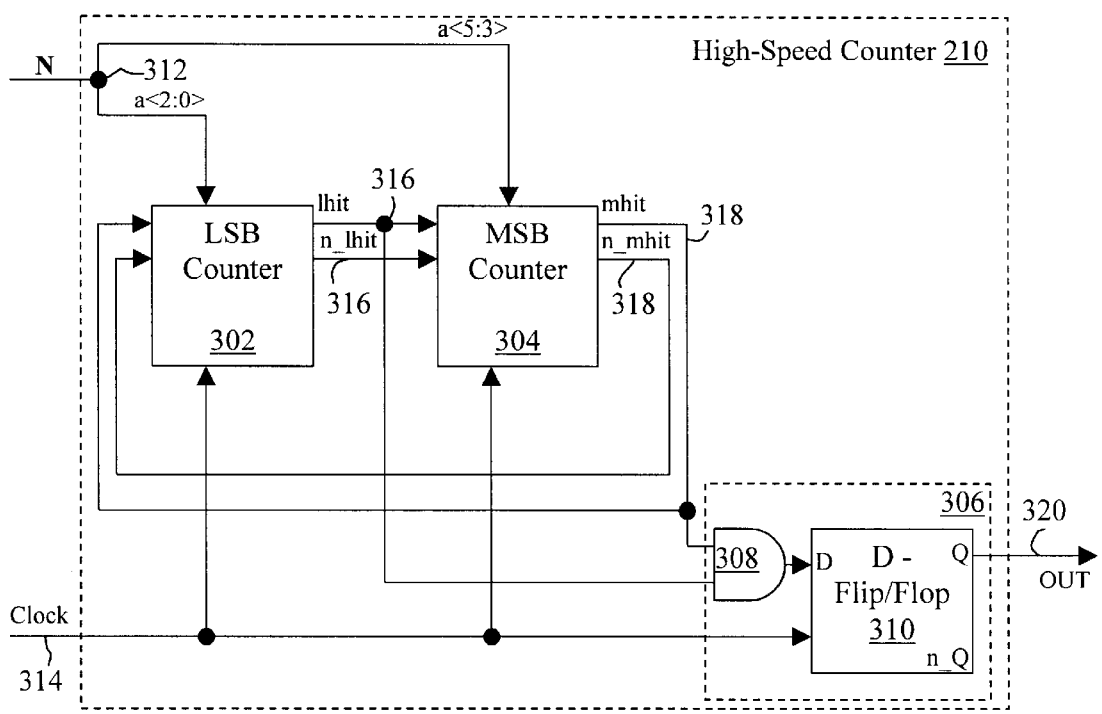
FIG. 3 is a block diagram of a high-speed programmable synchronous counter for a phase locked loop.

Referring now to FIG. 3, an embodiment of a high-speed programmable synchronous counter ("High-Speed Counter") 210 is shown. The counter 210 has a count value input node 312, a clock input node 314, and an output node 320. The counter 210 may be programmed with a count value N provided at the count value input node 312. The count value N designates a number by which the VCO output clock signal is divided to derive the feedback clock signal. The count value N is represented in binary form by multiple bits including least-significant bits a<2:0> and multiple most-significant bits a<5:3>.

A clock signal is provided at the clock input node 314. The clock signal may be an output clock signal of the VCO 208. The counter 210 is configured to derive the feedback clock signal pulse at the output node 320 for each sequential N pulses of the clock signal provided at the clock input node 314. Accordingly, the counter 210 generates a feedback clock signal having a frequency that is 1/Nth of the frequency of the clock signal provided at the clock input node 314.

The counter 201 includes a least-significant-bit counter ("LSB Counter") 302, a most-significant-bit counter ("MSB Counter") 304, and an output circuit 306. The least-significant bits a<2:0> received at the count value input node 312 are provided to the LSB counter 302. Similarly, the most significant bits a<5:3> received at the count value input node 312 are provided to the MSB counter 304. The LSB counter 302 and the MSB counter 304 are configured to multiple have programmable sequential count states. The LSB counter 302 is programmed to an initial count state that is associated with the least significant bits a<2:0> and the MSB counter 304 is programmed to an initial state associated a with the most-significant bits.

The LSB counter 302 decrements the least-significant-bit count state from the initial state to a zero-count state. For each pulse of the clock signal, the LSB counter 302 decrements a single count state. When the LSB counter 302 has a zero-count state, the LSB counter generates a zero state signal "lhit" at a LSB output node 316. When the LSB counter has a non-zero state, the LSB counter generates a non-zero state signal "n_lhit" at the LSB output node 316. By way of example, when the least significant bits a<2:0> have a count value of "3," the LSB counter 302 is programmed to the initial state associated with "3." During each subsequent clock pulse received at the clock input node 314, the LSB counter 302 decrements a single state. When the LSB counter 302 has a zero state, which occurs after 3 clock signal pulses, the LSB counter 302 generates a zero state signal "lhit" at the LSB output node 316.

The MSB counter 304 is coupled with the LSB output node 316. The MSB counter 304 is configured to decrement the most-significant-bit count state from the initial state to a zero-count state. For each pulse of the clock signal, the MSB counter 304 determines whether to decrement to a succeeding MSB counter state. The MSB counter 304 decrements a single state during a clock pulse when the LSB counter 302 generates the zero state signal "lhit" at the LSB output node 316. The MSB counter 304 does not change the MSB counter state during a clock pulse signal when the LSB counter generates the non-zero state signal "n_lhit" at the LSB output node 316. When the MSB counter 304 has a zero-count state, the MSB counter 304 generates a zero state signal "mhit" at a MSB output node 318. When the MSB counter has a non-zero state, the MSB counter generates a nonzero signal "n_mhit" at the MSB output node 318.

In an embodiment, the LSB counter 302 may be coupled with the MSB counter output node 318. The LSB counter 302 may be configured to reset the LSB count state to a highest state during a clock pulse when the LSB counter 302 has a zero state and the MSB counter 304 has a non-zero state signal "n_mhit" provided at the MSB output node. During subsequent clock pulses, the LSB counter 302 decrements the LSB counter state to a zero state for the LSB counter 302. When the LSB counter 302 and the MSB counter 304 each have a zero-count state, the LSB counter 302 may be programmed to the initial state with the least significant bits a<2:0>. Similarly, when the LSB counter 302 and the MSB counter 304 each have a zero-count state the MSB counter 304 may be programmed to the initial state with the most significant bits a<5:3>. The zero-count state for the LSB counter 302 may determined by detecting the zero-count signal "lhit" generated at the LSB counter output node 316. The zero-count state for the MSB counter 304 may be determined by detecting the zero-count signal "mhit" generated at the MSB counter output node 318.

The clock signal provided at the clock input node 314 may have a variable frequency. In an embodiment, the clock signal has a maximum frequency of 2.5 Gigahertz. The counter 210 may be at least a 6-bit synchronous counter having a 3-bit synchronous MSB counter 304 synchronized with a 3-bit synchronous LSB counter 302. Other embodiments, such as an 8-bit counter having two 4-bit synchronous counters, or a 7-bit counter having a 3-bit counter and a 4-bit counter may be implemented.

The output circuit 306 is configured to latch the feedback clock pulse at the output node 320. The output circuit 306 provides the feedback clock pulse when the MSB counter 304 generates a zero state signal "mhit" and LSB counter 302 generates a zero state signal "lhit." The output circuit 306 may include a gate 308 and a latch 310. The gate 308 is coupled with the output nodes 316 and 318. When "mhit" and "lhit" have a logic value "1" the gate 308 provides a signal to the latch 310. In response, the latch 310 generates a clock pulse to the output node 320. In an embodiment, the gate 308 is a logic AND gate and the latch 310 is a D-type flip/flop. The output circuit 306 may be implemented with any combination of logic gate 308 and latch 310. For example, the gate 308 may be any multiple input, single output logic gate, such as an OR gate, a NAND gate, NOR gate, XOR gate, or multiplexer. Similarly, the latch 310, may be any design flip/flop, such as an S/R-type flip/flop, or a J/K type flip/flop.

Figure 4:
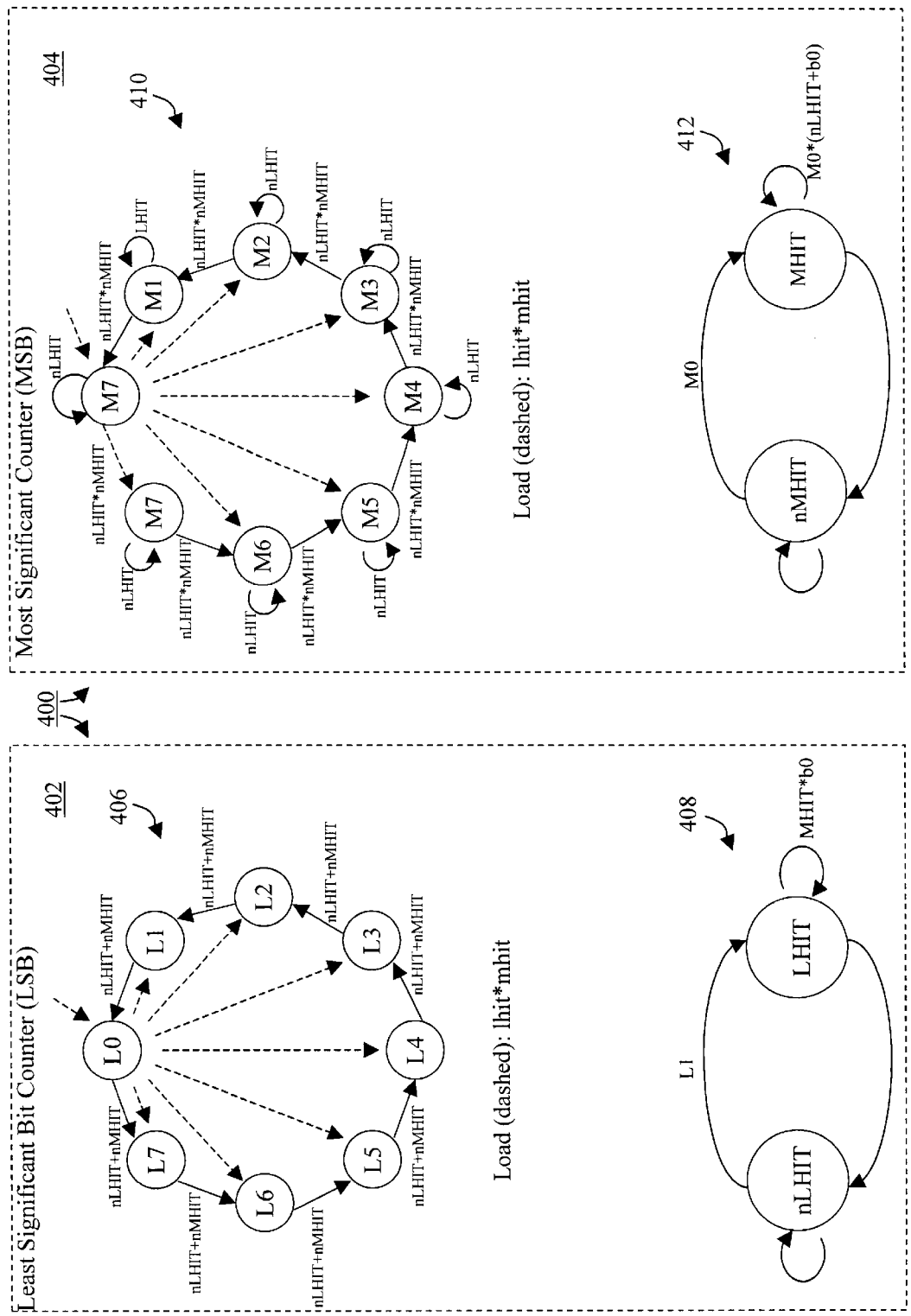
FIG. 4 illustrates state diagrams for a high-speed programmable synchronous counter.

Referring now to FIG. 4, exemplary state diagrams 400 are shown for a 6-bit synchronous counter having two 3-bit counters. The state diagrams include a LSB counter state diagram 402 and a MSB counter state diagram 404. The LSB counter state diagram 402 includes a state diagram 406 for a count circuit for the LSB counter 302 and a state diagram 408 for the output signal for the LSB counter 302. The MSB counter state diagram 404 includes a state diagram 410 for a count circuit for the MSB counter 304 and a state diagram 412 for the output signal for the MSB counter 304. The state diagrams 402 and 404 illustrate an operation for each 3-bit counter of the 6-bit high-speed synchronous counter 210. The state diagrams 406 and 410 for a count state, illustrate when the state for the LSB counter 302 and the state for the MSB counter 304, respectively, are decremented. The state diagrams 408 and 412 illustrate when the LSB counter 302 output signal "lhit" and the MSB counter 304 output signal "mhit" are switched.

Figure 5:
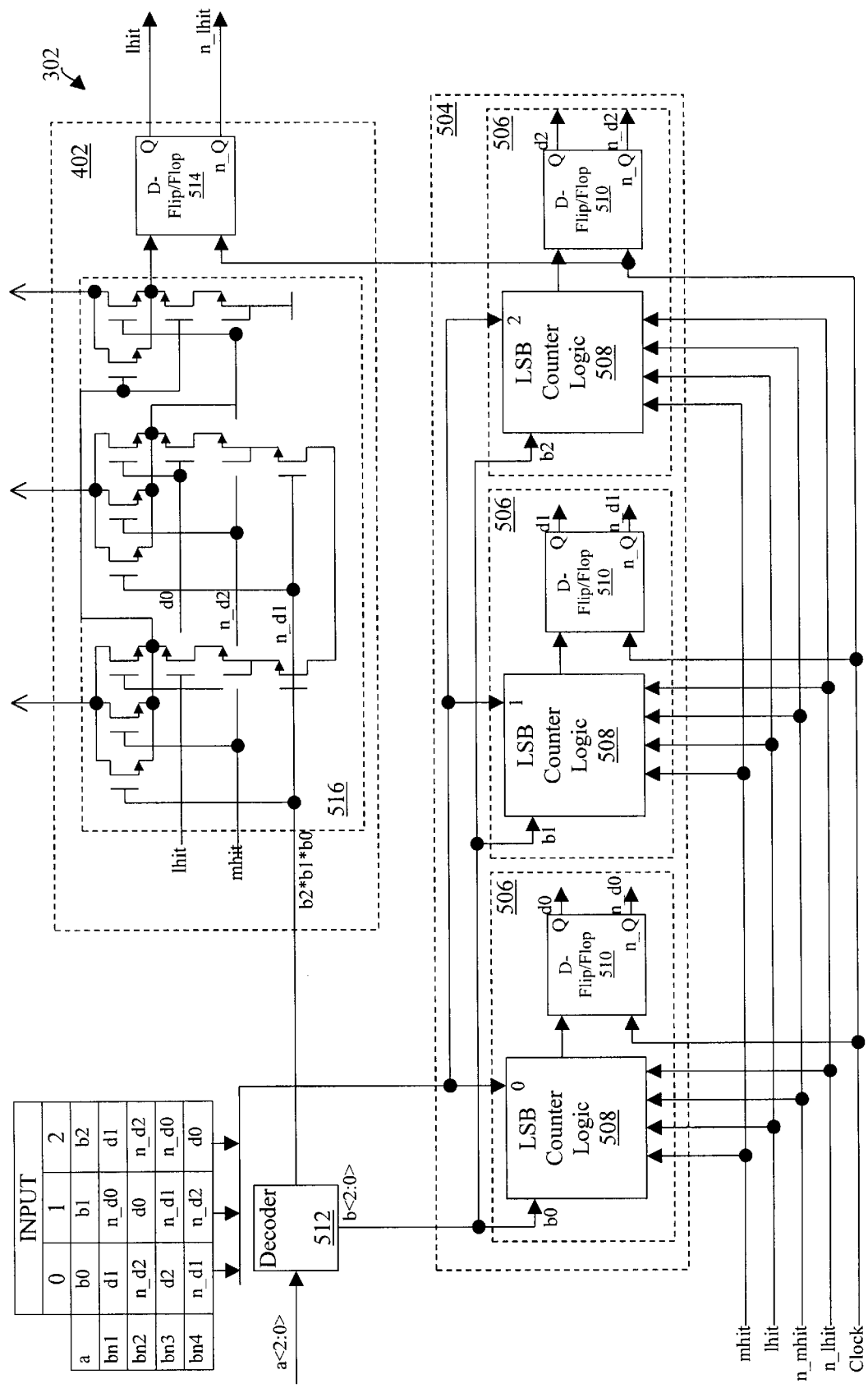
FIG. 5 is a block diagram for a least-significant-bit counter component of the high-speed programmable synchronous counter.

Referring now to FIG. 5, a block diagram for an exemplary 3-bit LSB counter 302 configured to operate according to the state diagram 402 of FIG. 4 is shown. The LSB counter 302 includes a LSB zero-state circuit 502 and a LSB count circuit 504. The LSB counter 302 may further include a decoder 512. The decoder 512 may be coupled with the count value input node 312. The decoder may be configured to receive the least significant bits a<2:0>. In one embodiment, the decoder 512 may be configured to program the LSB counter 302 to the initial state associated with the least significant-bits a<2:0>. When the LSB counter 302 is configured to sequentially decrement according to a Gray Code, the decoder may be configured to convert the least-significant bits a<2:0> to a corresponding Gray Code value. The decoder 512 programs the LSB counter 302 to the initial state associated with the Gray Coded least significant bits a<2:0>.

The LSB count circuit 504 is configured to generate a least-significant-bit count value. The LSB count circuit 504 includes a LSB decrement circuit 508 corresponding to each of the least-significant-bits a<2:0>. The LSB decrement circuits 506 have a bit input b0, b1, and b2, and a bit value output d0, d1, and d2. The decrement circuit 506 may have a LSB counter logic circuit 508 and a latch 510. An input for the latch 510 is coupled with an output of the LSB counter logic circuit 508. An output for the latch 510 provides the bit value d0, d1, and d2. It is preferred that the latch 510 is a D-Type flip/flop. The latch 510 may be any type of digital flip/flop having a data storage state, such as a J/K-type flip/flop, or S/R-type flip/flop.

The initial state for the LSB counter 302 is programmed by setting the state of each latch 510 to a corresponding value b0, b1, and b2 provided by the decoder 512. For each clock pulse, the LSB count circuit 504 decrements the least-significant-bit count value. The LSB counter logic 508 determines a next state for the corresponding latch 510 based on the counter outputs "mhit," "lhit," "n_mhit" and "n_lhit," and the outputs d0, d1, and d2 provided at an input of the counter logic 508. The LSB counter logic 508 generates a signal corresponding to the next state for the latch 510. The latch 510 provides the next state at the outputs d0, d1, and d2. Collectively, the outputs d0, d1, and d2 provide the count value for the state of the LSB counter 302.

The LSB zero-state circuit 502 generates the zero-state output "lhit" according to the output signal state diagram 408 of FIG. 4. The LSB zero-state circuit 502 may include logic switches 516 and a latch 514 coupled with the logic switches. The logic switches 516 may be configured with complementary metal-oxide semiconductor (CMOS) transistors. The CMOS transistors are arranged to determine the zero-state for the LSB counter 302. The logic switches 516 determine the zero-state for the LSB counter 302 during a clock pulse prior to the zero state of the LSB counter 302. During a clock pulse when the LSB counter 302 has a zero state, the logic switches 516 shift the state of the latch 514 to provide the zero-state signal "lhit." In an embodiment, the latch 514 is a D-Type flip/flop. The latch 514 may be any type of digital flip/flop having a data storage state, such as a J/K-type flip/flop, or S/R-type flip/flop.

Figure 6:
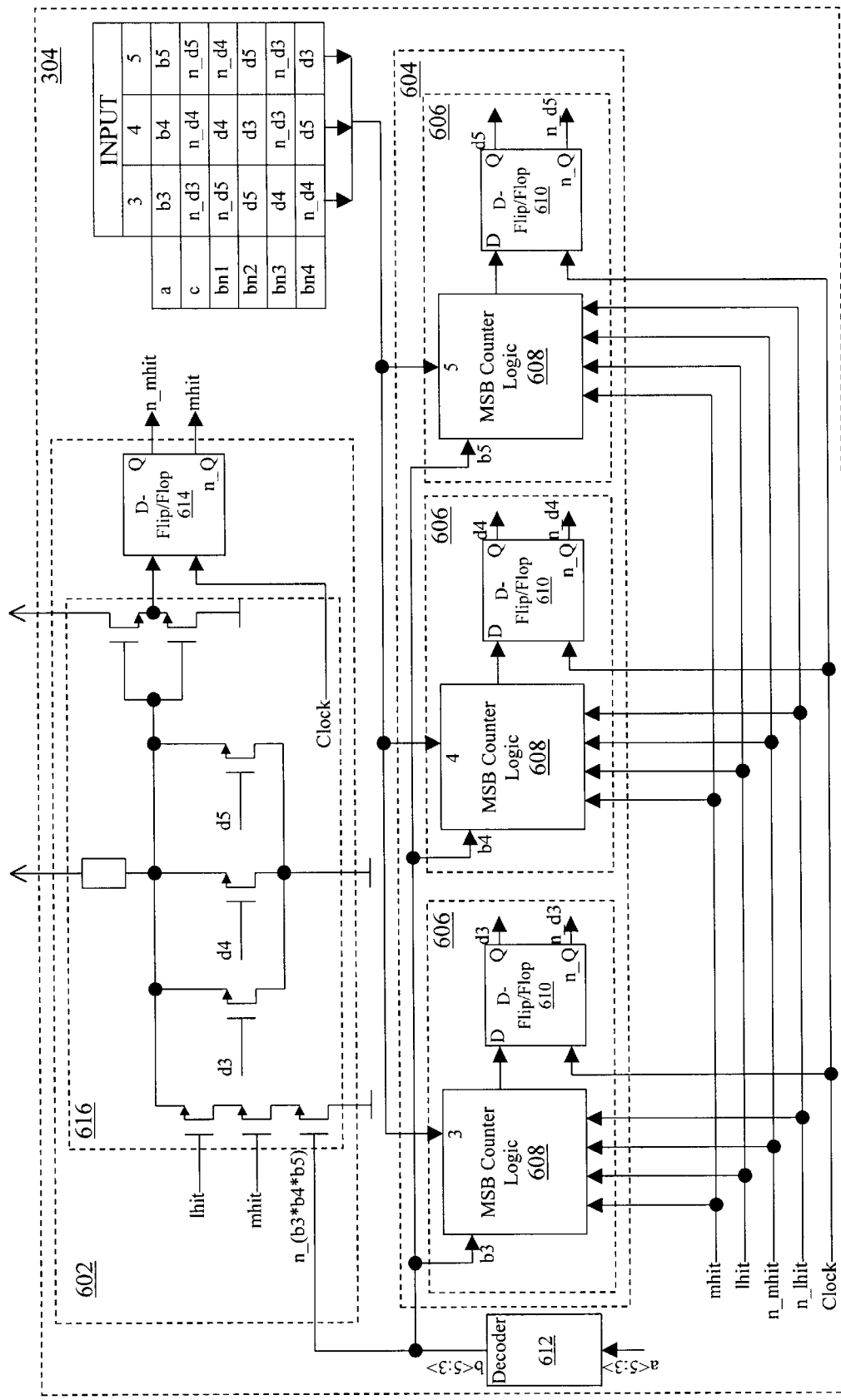
FIG. 6 is a block diagram for a most-significant-bit counter component of the high-speed programmable synchronous counter.

Referring now to FIG. 6, a block diagram for an exemplary 3-bit MSB counter 304 configured to operate according to the state diagram 404 of FIG. 4 is shown. The MSB counter 304 includes a MSB zero-state circuit 602 and a MSB count circuit 604. The MSB counter 304 may further include a decoder 612. The decoder 612 may be coupled with the count value input node 312. The decoder may be configured to receive the most-significant bits a<5:3>. In one embodiment, the decoder 612 may be configured to program the MSB counter 304 to the initial state associated with the least significant-bits a<5:3>. When the MSB counter 304 is configured to decrement according to a Gray Code, the decoder may be configured to convert the most-significant bits to a corresponding Gray Code value. The decoder 612 is configured to program the MSB counter 304 to the initial state associated with the Gray Coded most-significant bits a<5:3>.

The MSB count circuit 604 is configured to generate a most-significant-bit count value. The MSB count circuit 604 includes a MSB decrement circuit 608 corresponding to each of the most-significant-bits a<5:3>. The MSB decrement circuits 606 have a bit input b3, b4, and b5, and a bit value output d3, d4, and d5. The decrement circuit 606 may have a MSB counter logic circuit 608 and a latch 610. An input for the latch 610 is coupled with an output of the MSB counter logic circuit 608. An output for the latch 610 provides the bit value d3, d4, and d5. It is preferred that the latch 610 is a D-Type flip/flop. The latch 610 may be any type of digital flip/flop having a data storage state, such as a J/K-type flip/flop, or S/R-type flip/flop.

The initial state for the MSB counter 304 is programmed by setting the state for each latch 610 to a corresponding value b3, b4, and b5 provided by the decoder 612. The MSB count circuit 604 decrements the most-significant-bit count value when the LSB counter 302 provides the zero-count signal at the output node 316. The MSB counter logic 608 determines a next state for the latch 610 based on the counter outputs "mhit," "lhit," "n_mhit," and "n_ihit," and the outputs d3, d4, and d5 provided at an input of the counter logic 608. The MSB counter logic 608 generates a control signal corresponding to the next state for the corresponding latch 610. The latch provides the next state at the outputs d3, d4, and d5. Collectively, the outputs d3, d4, and d5 provide the count value for the state of the MSB counter 304.

The MSB zero-state circuit 602 generates the zero-state output "mhit" according to the output signal state diagram 410 of FIG. 4. The MSB zero-state circuit 602 may include logic switches 616 and a latch 614 coupled with the logic switches. The logic switches 616 may be configured with CMOS transistors arranged to determine the zero-state for the MSB counter 304. The logic switches 616 determine the zero-state for the MSB counter 304 during a clock pulse prior to the zero state of the MSB counter. During a clock pulse when the MSB counter 304 has a zero state, the logic switches 616 shift the state of the latch 614 to provide the zero-state signal "mhit." In an embodiment, the latch 614 is a D-Type flip/flop. The latch 614 may be any type of digital flip/flop having a data storage state, such as a J/K-type flip/flop, or S/R-type flip/flop.

Figure 7:
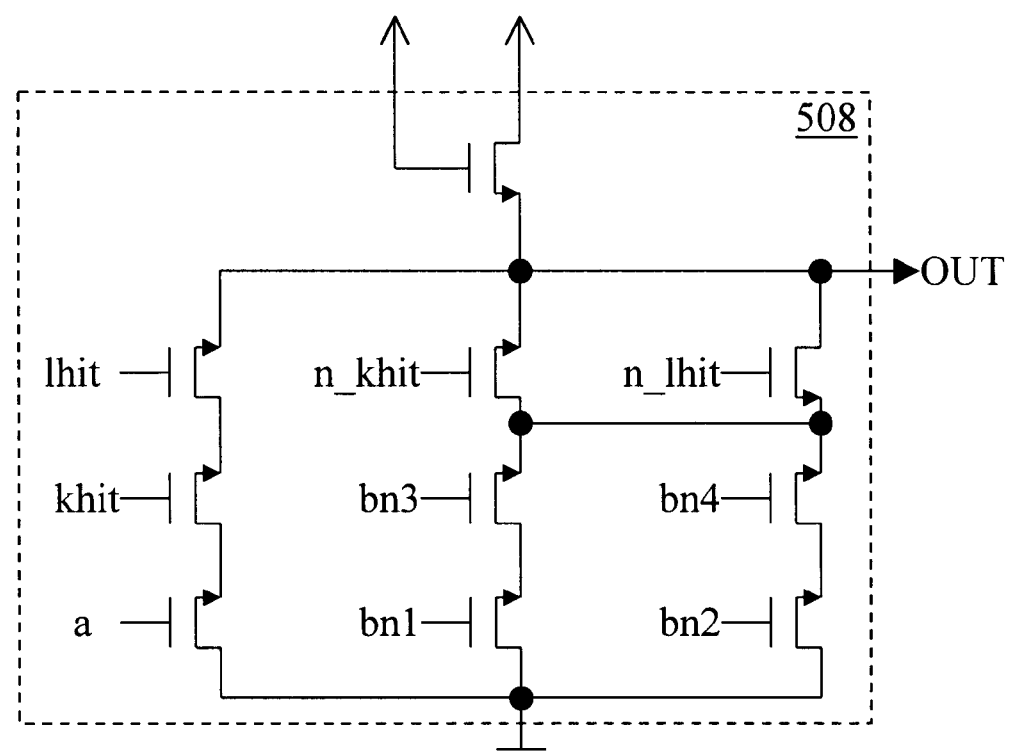
FIG. 7 is a is a schematic diagram for logic circuit of the least-significant-bit counter.

Referring now to FIG. 7, an exemplary circuit for the LSB counter logic 508 is shown. The LSB counter logic 508 may be implemented with transistors arranged in a CMOS configuration having one or more PMOS transistors and one or more NMOS transistors. In an embodiment, the PMOS transistor may be configured as a pull-up device and the NMOS transistors are configured to provide logic switching for the LSB counter logic output. In another embodiment, the PMOS transistor is a pull-up resistive device.

Figure 8:
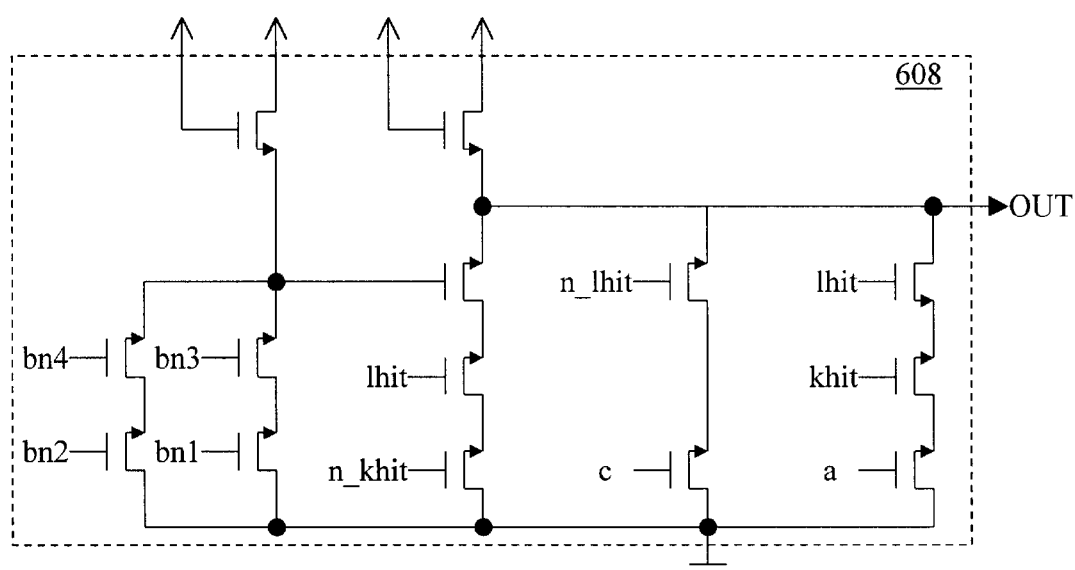
FIG. 8 is a schematic diagram for logic circuit of the most-significant-bit counter.

Referring now to FIG. 8, an exemplary circuit for the MSB counter logic 608 is shown. The LSB counter logic 608 may be implemented with transistors arranged in a CMOS configuration having one or more PMOS transistors and one or more NMOS transistors. In an embodiment, the PMOS transistor may be configured as a pull-up device and the NMOS transistors are configured to provide logic switching for the MSB counter logic output. In another embodiment, the PMOS transistor is a pull-up resistive device.

It is preferred that the CMOS transistors described herein be configured to operate with a supply voltage less than 2.0 V. In an embodiment, the CMOS transistors have a channel length less than 0.18 micron and are operable at a supply voltage of less than 1.8V.

Figure 9:
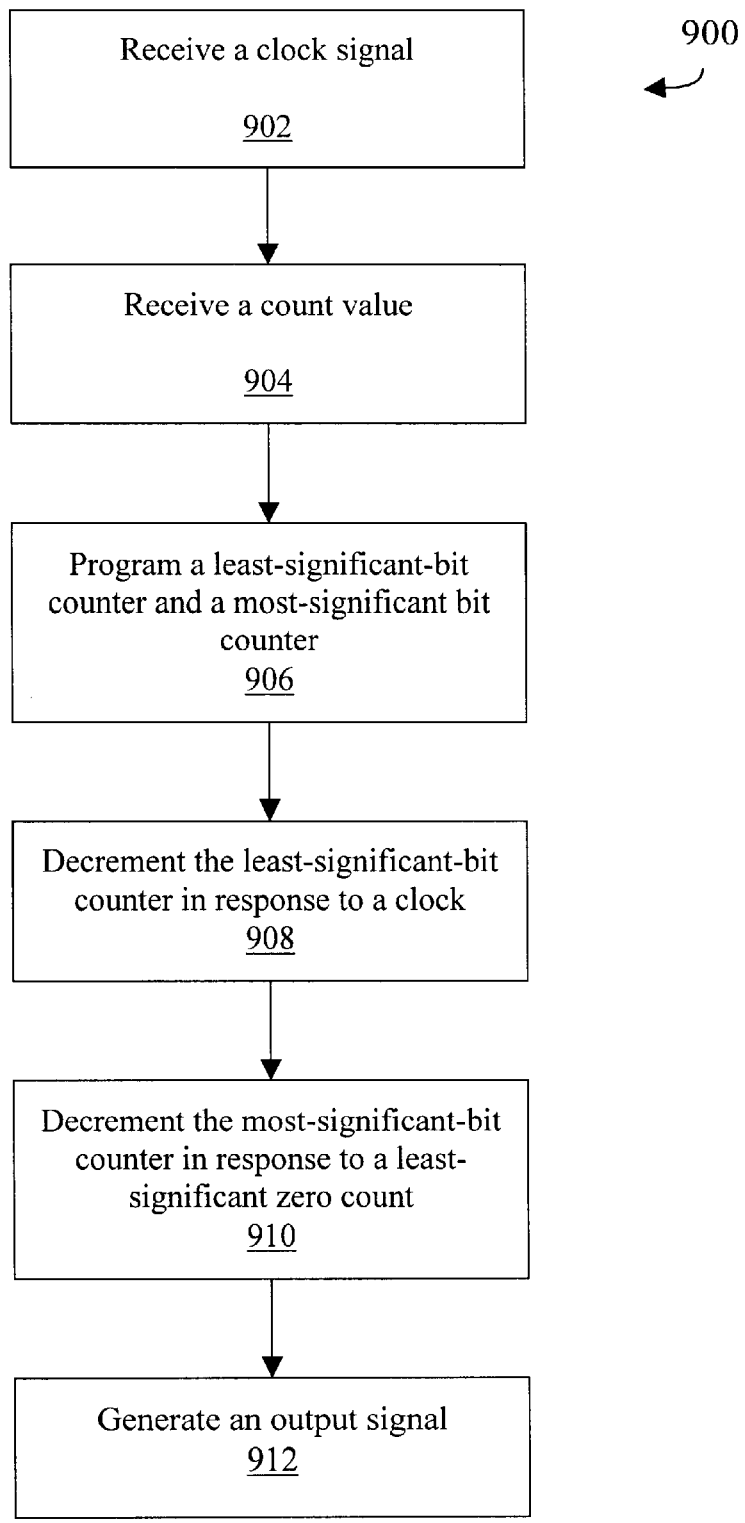
FIG. 9 illustrates a flowchart according to an exemplary method for counting high-speed clock pulses.

Referring to FIG. 9, a flowchart for a method 900 for counting high-speed clock pulses is shown. The method includes the acts of receiving 902 a clock signal; receiving 904 a count value; programming 906 an LSB counter and a MSB counter; decrementing 908 the LSB counter in response to the clock signal; decrementing 910 the MSB counter in response to a least-significant-bit counter zero-count signal; and generating 912 an output signal in response to the least-significant-bit zero-count signal and a most-significant-bit zero-count signal.

The act of receiving 904 a count value includes receiving least-significant bits and most-significant bits. The least-significant-bits and the most significant bits collectively represent the count value for the high-speed counter.

The act of programming 906 includes programming the LSB counter with the least significant bits and the MSB counter with the MSB counter. Programming the LSB counter and the MSB counter sets the LSB counter and the MSB to an initial state.

The act of decrementing 908 a LSB counter includes generating a least-significant-bit zero-count signal when the LSB counter has a zero state. Similarly, decrementing a MSB counter includes generating a most-significant-bit zero-count signal when the most-significant-bit counter has a zero state. The least-significant-bit zero-count signal is provided at an output node for the LSB counter and the most-significant-bit count signal is provided at an output node for the LSB counter.

Various implementations of methods can be realized that are within the scope of the present invention. A high-speed programmable synchronous counter capable of deriving a feedback clock signal from a high-speed clock signal can be obtained. The present embodiment is applicable to a high-speed programmable synchronous counter for a PRML based read/write channel for hard disk drive. In particular, the high-speed programmable synchronous counter may be provided as a component of a feedback circuit of a phase locked loop.

All of the components of the high-speed programmable synchronous counter may be integrated with the read/write channel on a single integrated circuit semiconductor chip. Alternatively, some or all of the components of the counter circuit may be implemented in one or more integrated circuits external to a read/write channel.

While particular embodiments of the present invention have been shown and described, modifications may be made. It is therefore intended in the appended claims, including all equivalents, cover all such changes and modifications.

What is claimed is:

1. A programmable high-speed counter, comprising:
   a clock input circuit operative to receive a clock signal at a clock input node;
   a least-significant-bit counter coupled with the clock input node and operative to decrement a least-significant-bit count value in response to the clock signal and to provide a least significant-bit zero state signal at a least-significant-bit output node;
   a most-significant-bit counter coupled with the least-significant-bit output node and operative to decrement a most-significant-bit count value in response to the least-significant-bit zero-count value and to provide a most-significant-bit zero state signal at a most-significant-bit output node;
   a count input circuit configured to receive a count value including least-significant-bits and most-significant-bits, the count input circuit operative to program the least-significant-bit counter with the least significant bits and to program the most-significant-bit counter with the most significant bits; and
   a counter output circuit operative to provide a clock pulse at a counter output node in response to the least-significant-bit zero state signal and the most-significant-bit zero state signal.

2. The high-speed counter of claim 1, wherein the least-significant-bit counter is coupled with the most-significantbit output node, the least-significant-bit counter being configured to reset the least-significant-bit count value in response to the least-significant-bit zero state signal and a most-significant-bit non-zero-count signal.

3. The high-speed counter of claim 2, wherein the least-significant-bit counter comprises:
   a least-significant-bit count circuit operative to generate a least-significant-bit count value and to decrement the least-significant-bit count value in response to the clock signal; and
   a least-significant-bit zero-state circuit coupled with the least-significant-bit decrement circuit and operative to provide the least-significant-bit zero state signal at the least-significant-bit output node when the least significant-bit decrement circuit generates a zero-count value.

4. The high-speed counter of claim 3, wherein the least-significant-bit count circuit comprises a least-significant-bit decrement circuit corresponding to each of the least-significant-bits.

5. The high-speed counter of claim 4, wherein each least-significant-bit decrement circuit comprises:
   a least-significant-bit logic circuit operative to determine a subsequent least significant bit value; and
   a least-significant-bit latch operative to couple the least-significant bit value to a least-significant-bit value output.

6. The high-speed counter of claim 5, wherein the least-significant-bit counter comprises a digital synchronous 3-bit counter.

7. The high-speed counter of claim 6, wherein the least-significant-bit counter is configured to decrement the least-significant-bit count value according to a Gray Code.

8. The high-speed counter of claim 7, wherein the least-significant-bit logic circuit comprises one or more PMOS transistors and one or more NMOS transistors configured in a CMOS arrangement.

9. The high-speed counter of claim 8, wherein the PMOS transistors are configured as pull-up devices.

10. The high-speed counter of claim 9, wherein the counter output circuit comprises:
    a logic gate having a least-significant-bit input coupled with the least-significant-bit counter output node and a second input coupled with the most-significant-bit counter output node, the logic gate being operative to provide a logic signal at a gate output node in response to the least-significant-bit counter zero state and the most-significant-bit counter zero state; and
    a latch coupled with the logic gate output node and operative to provide the clock pulse at the counter output node in response to logic signal from the logic gate.

11. The high-speed counter of claim 10, wherein the pulse signal comprises a periodic single pulse of the clock signal having a frequency between 100 Megahertz and 2.5 Gigahertz.

12. The high-speed counter of claim 2, wherein the most-significant-bit counter is operative to decrement the most-significant-bit count value in response to the least significant-bit zero-count.

13. The high-speed counter of claim 12, wherein the most-significant-bit counter, comprises:
    a most-significant-bit count circuit operative generate a most-significant-bit count value and to decrement the most-significant-bit count value in response to the clock signal; and
    a most-significant-bit zero-state circuit coupled with the most-significant-bit decrement circuit and operative to provide the most-significant-bit zero state signal at the most-significant-bit output node when the most-significant-bit decrement circuit generates a zero-count value.

14. The high-speed counter of claim 13, wherein the most-significant-bit count circuit comprises a most-significant-bit decrement circuit corresponding to each of the most-significant-bits.

15. The high-speed counter of claim 14, wherein each most-significant-bit decrement circuit comprises:
    a most-significant-bit logic circuit operative to determine a subsequent most significant bit value; and
    a most-significant-bit latch operative to couple the most-significant bit value to a most-significant-bit value output.

16. The high-speed counter of claim 15, wherein the most-significant-bit counter comprises a digital synchronous 3-bit counter.

17. The high-speed counter of claim 16, wherein the most-significant-bit counter is configured to decrement the most-significant-bit count value according to a Gray Code.

18. The high-speed counter of claim 17, wherein the least-significant-bit logic circuit comprises one or more PMOS transistors and one or more NMOS transistors configured in a CMOS arrangement.

19. The high-speed counter of claim 18, wherein the PMOS transistors are configured as pull-up devices.

20. The high-speed counter of claim 19, wherein the counter output circuit comprises:
    a logic gate having a least-significant-bit input coupled with the least-significant-bit counter output node and a second input coupled with the most-significant-bit counter output node, the logic gate being operative to provide a logic signal at a gate output node in response to the least-significant-bit counter zero state and the most-significant-bit counter zero state; and
    a latch coupled with the logic gate output node and operative to provide the clock pulse at the counter output node in response to logic signal from the logic gate.

21. The high-speed counter of claim 20, wherein the pulse signal comprises a periodic single pulse of the clock signal having a frequency between 100 Megahertz and 2.5 Gigahertz.

22. A method of counting high-speed clock pulses, the method comprising the acts of:
    receiving a clock signal;
    receiving a count value including least significant bits and most significant bits;
    programming a least-significant-bit counter with the least-significant bits and a most-significant-bit counter with the most-significant bits;
    decrementing the least-significant-bit counter in response to the clock signal and generating a least-significant-bit zero-count signal when the least-significant-bit counter has a zero value;
    decrementing the most-significant-bit counter in response to the least-significant-bit zero-count signal and generating a most-significant-bit zero-count signal when the most-significant-bit counter has a zero value; and
    generating an output signal in response to the least-significant-bit zero-count signal and the most-significant-bit zero-count signal.

23. The method of counting high-speed clock pulses of claim 22, further comprising the acts of:
generating a most-significant-bit non-zero-count signal when the most-significant-bit counter has a non-zero value; and
resetting the least-significant bit counter in response to the least-significant-bit zero-count signal and a most-significant-bit non-zero-count signal.

24. The method of counting high-speed clock pulses of claim 23, wherein the act of receiving a clock signal comprises receiving a clock signal having a substantially periodic square wave with a frequency between 100 Megahertz and 2.5 Gigahertz.

25. The method of counting high-speed clock pulses of claim 24, wherein the act of decrementing the least-significant bit counter comprises decrementing a 3-bit synchronous counter implemented with CMOS circuits having PMOS transistors and NMOS transistors, wherein the PMOS transistors are configured as pull-up devices.

26. The method of counting high-speed clock pulses of claim 25, wherein the act of decrementing the most-significant comprises decrementing a 3-bit synchronous counter implemented with CMOS circuits having PMOS transistors and NMOS transistors, wherein the PMOS transistors are configured as pull-up devices.

27. A hard-disk drive comprising a partial response, maximum likelihood based read/write channel having a phase locked loop, the phase locked loop having a high-speed programmable synchronous counter coupled in a feedback loop.

28. The hard-disk drive of claim 27, wherein the high-speed programmable synchronous counter comprises:
a clock input circuit operative to receive a clock signal at a clock input node;
a least-significant-bit counter coupled with the clock input node and operative to decrement a least-significant-bit count value in response to the clock signal and to provide a least significant-bit zero state signal at a least-significant-bit output node;
a most-significant-bit counter coupled with the least-significant-bit output node and operative to decrement a most-significant-bit count value in response to the least-significant-bit zero-count value and to provide a most-significant-bit zero state signal at a most-significant-bit output node;
a count input circuit configured to receive a count value including least-significant-bits and most-significant-bits, the count input circuit operative to program the least-significant-bit counter with the least significant bits and to program the most-significant-bit counter with the most significant bits; and
a counter output circuit operative to provide a clock pulse at a counter output node in response to the least-significant-bit zero state signal and the most-significant-bit zero state signal.

29. The hard-disk drive of claim 28, wherein the least-significant-bit counter is coupled with the most-significant-bit output node, the least-significant-bit counter being configured to reset the least-significant-bit count value in response to the least-significant-bit zero state signal and a most-significant-bit non-zero-count signal.

30. The hard-disk drive of claim 29, wherein the least-significant-bit counter comprises:
a least-significant-bit count circuit operative to generate a least-significant-bit count value and to decrement the least-significant-bit count value in response to the clock signal; and
a least-significant-bit zero-state circuit coupled with the least-significant-bit decrement circuit and operative to provide the least-significant-bit zero state signal at the least-significant-bit output node when the least significant-bit decrement circuit generates a zero-count value.

31. The hard-disk drive of claim 30, wherein the most-significant-bit counter, comprises:
a most-significant-bit count circuit operative generate a most-significant-bit count value and to decrement the most-significant-bit count value in response to the clock signal; and
a most-significant-bit zero-state circuit coupled with the most-significant-bit decrement circuit and operative to provide the most-significant-bit zero state signal at the most-significant-bit output node when the most-significant-bit decrement circuit generates a zero-count value.

32. The hard-disk drive of claim 31, wherein the least-significant-bit logic counter and the most-significant bit counter comprise are configured with transistors having in a CMOS arrangement having a PMOS transistor configured as a pull-up device.

* * * * *

UNITED STATES PATENT AND TRADEMARK OFFICE
CERTIFICATE OF CORRECTION

PATENT NO. : 6,690,525 B2
DATED : February 10, 2004
INVENTOR(S) : Michael A. Ruegg et al.

It is certified that error appears in the above-identified patent and that said Letters Patent is hereby corrected as shown below:

<u>Title page,</u>
Item [56], References Cited, U.S. PATENT DOCUMENTS, should read:
-- 5,729,396 B1     3/1998     Dudley
   4,975,931 B1    12/1990    Cosand
   5,274,796 B1    12/1993    Conner --.

<u>Column 12,</u>
Line 48, delete "least significant-bit" and substitute -- least-significant-bit -- in its place.
Lines 57 and 58, delete "least significant bits" and substitute -- least-significant-bits -- in its place.

<u>Column 13,</u>
Lines 7, 8 and 9, delete "least significant-bit" and substitute -- least significant-bit -- in its place.
Lines 26 - 27, delete "least-significant bit" and substitute -- least-significant-bit -- in its place.
Line 60, delete "least significant-bit" and substitute -- least-significant-bit -- in its place --

<u>Column 14,</u>
Line 14, immediately after "counter" delete "," (comma); and in line 17, after "circuit operative" insert -- to --.
Line 14, delete "most significant bit" and substitute -- most-significant-bit -- in its place.
Lines, 16-17, delete "most-significant bit" and substitute -- most-significant-bit -- in its place.
Line 51, delete "least significant bits" and substitute -- least-significant-bits -- in its place.
Line 55, delete "most significant bits;" and substitute -- most-significant-bits; -- in its place.
Line 56, delete "least-significant bits;" and substitute -- least-significant-bits; -- in its place.
Line 60, delete "most-significant bits;" and substitute -- most-significant-bits; -- in its place.

<u>Column 15,</u>
Line 6, delete "least-significant bit" and substitute -- least-significant-bit -- in its place.
Lines 15-16, delete "least-significant bit" and substitute -- least-significant-bit -- in its place.

UNITED STATES PATENT AND TRADEMARK OFFICE
CERTIFICATE OF CORRECTION

PATENT NO. : 6,690,525 B2
DATED : February 10, 2004
INVENTOR(S) : Michael A. Ruegg et al.

It is certified that error appears in the above-identified patent and that said Letters Patent is hereby corrected as shown below:

<u>Column 15, (cond't),</u>
Lines 39, delete "least significant-bit" and substitute -- least-significant-bit -- in its place.
Lines 44, delete "least significant bits" and substitute -- least-significant-bits -- in its place.

<u>Column 16,</u>
Line 4, delete "most significant bits;" and substitute -- most-significant-bits; -- in its place.
Line 27, delete "least significant-bit" and substitute -- least-significant-bit -- in its place.
Line 31, before "generate" insert -- to --.

<u>Column 17,</u>
Line 43, delete "most-significant bit" and substitute -- most-significant-bit -- in its place.

Signed and Sealed this

Twenty-ninth Day of March, 2005

JON W. DUDAS
*Director of the United States Patent and Trademark Office*